(12) United States Patent
Goettle, Jr. et al.

(10) Patent No.: US 10,312,995 B2
(45) Date of Patent: Jun. 4, 2019

(54) DIGITAL PAYLOAD WITH VARIABLE HIGH POWER AMPLIFIERS

(71) Applicant: Space Systems/Loral, LLC, Palo Alto, CA (US)

(72) Inventors: Peter Edward Goettle, Jr., Newtown, PA (US); Chris Hoeber, Los Altos, CA (US); William Stiles, San Jose, CA (US); Douglas G. Burr, San Jose, CA (US); Kathy Shockey, Los Gatos, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 192 days.

(21) Appl. No.: 14/965,620

(22) Filed: Dec. 10, 2015

(65) Prior Publication Data

US 2017/0041065 A1    Feb. 9, 2017

Related U.S. Application Data

(60) Provisional application No. 62/090,859, filed on Dec. 11, 2014.

(51) Int. Cl.
*H04B 7/185* (2006.01)
*H03F 1/02* (2006.01)
(Continued)

(52) U.S. Cl.
CPC ....... *H04B 7/18513* (2013.01); *H03F 1/0261* (2013.01); *H03F 1/0277* (2013.01);
(Continued)

(58) Field of Classification Search
None
See application file for complete search history.

(56) References Cited

U.S. PATENT DOCUMENTS 4,320,350 A   3/1982   Drapac
5,276,912 A   1/1994   Siwiak et al.
(Continued)

FOREIGN PATENT DOCUMENTS

CA    2490529 C      12/2003
EP    0 988 718 B1   5/2006
(Continued)

OTHER PUBLICATIONS

International Search Report and Written Opinion dated Mar. 3, 2016 issued in PCT/US2015/065223.
(Continued)

*Primary Examiner* — David Bilodeau
(74) *Attorney, Agent, or Firm* — Weaver Austin Villeneuve & Sampson LLP

(57) ABSTRACT

A spacecraft includes a payload subsystem including a plurality of transmit antenna feeds, a digital channelizer, and a power amplification arrangement including a plurality of power amplifiers. The power amplification arrangement has at least one input communicatively coupled with an output of the digital channelizer and at least one output communicatively coupled with at least one of the plurality of transmit antenna feeds. A processor is configured to control the digital channelizer, and to adjust a saturated output power of at least one power amplifier of the plurality of power amplifiers in the power amplification arrangement.

19 Claims, 6 Drawing Sheets

(51) Int. Cl.
*H04B 7/06* (2006.01)
*H03F 3/195* (2006.01)
*H03F 3/21* (2006.01)
*H03F 3/24* (2006.01)
*H03F 3/68* (2006.01)
*H03F 3/72* (2006.01)
*H04L 5/06* (2006.01)
*H04B 1/04* (2006.01)

(52) U.S. Cl.
CPC ............ *H03F 3/195* (2013.01); *H03F 3/211* (2013.01); *H03F 3/245* (2013.01); *H03F 3/68* (2013.01); *H03F 3/72* (2013.01); *H04B 1/0458* (2013.01); *H04B 7/0617* (2013.01); *H04B 7/18515* (2013.01); *H04L 5/06* (2013.01); *H03F 2200/429* (2013.01); *H03F 2203/7206* (2013.01); *H03F 2203/7236* (2013.01)

(56) References Cited

U.S. PATENT DOCUMENTS

| | | | | |
|---|---|---|---|---|
| 5,754,139 | A * | 5/1998 | Turcotte | H04B 7/2041 |
| | | | | 342/372 |
| 6,049,707 | A | 4/2000 | Buer et al. | |
| 6,442,148 | B1 | 8/2002 | Adams et al. | |
| 6,498,937 | B1 | 12/2002 | Smith | |
| 6,631,255 | B1 * | 10/2003 | Claxton | H03D 7/163 |
| | | | | 455/132 |
| 7,675,985 | B1 | 3/2010 | Watson | |
| 8,064,920 | B2 | 11/2011 | Bell et al. | |
| 8,103,225 | B2 * | 1/2012 | Couchman | H03F 1/0205 |
| | | | | 455/127.1 |
| 8,237,504 | B1 | 8/2012 | Moochalla et al. | |
| 8,401,058 | B1 | 3/2013 | Lam et al. | |
| 8,463,204 | B2 * | 6/2013 | Jones | H03F 1/32 |
| | | | | 455/101 |
| 8,588,343 | B2 * | 11/2013 | Moon | H03F 1/0294 |
| | | | | 375/329 |
| 8,718,582 | B2 | 5/2014 | See et al. | |
| 8,737,528 | B2 * | 5/2014 | Shin | H03F 3/602 |
| | | | | 375/297 |
| 2004/0224635 | A1 * | 11/2004 | Nicol | H03F 1/02 |
| | | | | 455/13.4 |
| 2006/0103460 | A1 * | 5/2006 | Eng | H03F 1/02 |
| | | | | 330/43 |
| 2006/0234626 | A1 * | 10/2006 | Goldberg | H03F 1/02 |
| | | | | 455/13.4 |
| 2007/0281612 | A1 * | 12/2007 | Benjamin | H04B 7/18515 |
| | | | | 455/13.3 |
| 2010/0226307 | A1 * | 9/2010 | Harverson | H04B 7/18515 |
| | | | | 370/316 |
| 2012/0071196 | A1 * | 3/2012 | Bergman | H03F 3/195 |
| | | | | 455/522 |
| 2013/0300499 | A1 * | 11/2013 | Sharawi | H03F 3/68 |
| | | | | 330/124 R |
| 2014/0038675 | A1 | 2/2014 | Khlat et al. | |
| 2014/0327576 | A1 * | 11/2014 | Kumar | H04B 7/086 |
| | | | | 342/367 |

FOREIGN PATENT DOCUMENTS

| | | |
|---|---|---|
| EP | 2 346 175 A1 | 7/2011 |
| EP | 1522155 B1 | 7/2012 |
| EP | 2 645 597 A1 | 10/2013 |
| EP | 3231085 | 10/2017 |
| WO | WO 2016094786 | 6/2016 |

OTHER PUBLICATIONS

Angeletti et al., "From 'Bent Pipes' to 'Software Defined Payload': Evolution and Trends of Satellite Communications Systems," 26th International Communications Satellite Systems Conference (ICSSC), AIAA 2008-5439, 2008, San Diego, CA, 10 pages.

Butash et al., "Leveraging Digital On-Board Processing to Increase Communications Satellite Flexibility and Effective Capacity," 28th International Communications Satellite Systems Conference (ICSSC-2010), AIAA 2010-8715, 2010, Anaheim, 10 pages.

McKinnon, "Evaluation of Flexible Payload Technologies for Use in Conventional GEO Communications Satellites," 26th International Communications Satellite Systems Conference (ICSSC), AIAA 2008-5420, San Diego, CA, 18 pages.

Moochalla et al., "Variable Output Power and Linear L-Band SSPA," 28th International Communications Satellite Systems Conference (ICSSC-2010), AIAA 2010-8817, 2010, Anaheim, CA, 7 pages.

Verma et al., "Next Generation Broadband Satellite Communication Systems," American Institute of Aeronautics and Astronautics, AIAA_1111, 7 pages.

International Preliminary Report and Written Opinion dated Jun. 22, 2017 issued in PCT/US2015/065223.

EP Office Action dated Mar. 22, 2018 in EP Application No. 15817712.1.

EP Office Action dated Sep. 3, 2018 in EP Application No. 15817712.1.

* cited by examiner

DIGITAL PAYLOAD WITH VARIABLE HIGH POWER AMPLIFIERS

CROSS-REFERENCE TO RELATED APPLICATIONS

This disclosure claims priority to U.S. Provisional Patent Application No. 62/090,859; filed Dec. 11, 2014, entitled "DIGITAL PAYLOAD WITH VARIABLE HIGH POWER AMPLIFIERS," and assigned to the assignee hereof, the disclosure of which is incorporated by reference in its entirety into this Patent Application.

TECHNICAL FIELD

This invention relates generally to a satellite communication payload, and more particularly to a digital payload that includes variable high power amplifiers and a digital channelizer.

BACKGROUND

The assignee of the present invention manufactures and deploys spacecraft for, inter alia, communications and broadcast services. Market demands for such spacecraft have imposed increasingly stringent requirements for payload flexibility and utilization efficiency. For example, most communications satellites contain multiple receive and transmit beams, and often it is not possible to accurately forecast the demand for satellite capacity in each beam, especially in developing market areas. Over the lifetime of a satellite, which can be more than 10-15 years, it is typical for demand of satellite services to increase more in some coverage areas and less in other coverage areas. Forecasting the regions in which demand increases will occur and the magnitude of the increase (region-by-region) is extraordinarily difficult.

The most common design technique to provide on-orbit flexibility that addresses the uncertainty in space segment demand is to implement analog radio frequency (RF) switches in key locations in the payload. For example, mechanical RF switches are usually placed in the input multiplexing networks and at the outputs of some of the high power RF amplifiers in the spacecraft payload. The switches in the vicinity of the input multiplexer (IMUX) are commandable in-orbit and can be set to steer bandwidth to beams where demand is high (and away from lower demand beams), typically in bandwidth increments of 27, 36, 54, or 72 MHz.

The switches at the outputs of the power amplifiers are also commandable in-orbit and may be configured to direct RF power to beams where demand is strong (and away from beams where demand is weak). The RF power is generally directed in increments equal to the rated (or "saturated") power of an individual amplifier, which may typically range from 10 to 200 W. Together, the switches in the IMUX and the switches after the amplifiers permit a satellite operator to tailor the bandwidth and RF power allocations among multiple coverage areas and beams to match the demand profile for satellite services. Such tailoring permits the operator to improve the overall usage and revenue generation of a communications satellite. However, because of spacecraft resource limitations of volume (for mounting hardware and routing cables and waveguides), mass, and thermal capacity, there is usually a limit to the number of amplifiers, output power of which may be routed to multiple beams.

Thus, there is a desire to find improved techniques that enable commandably reallocating RF bandwidth and RF power available for communications signals among a number of antenna beams to better match satellite resources to end user demand.

SUMMARY

The presently disclosed techniques relate to a spacecraft payload subsystem, where a processor may be configured to simultaneously control a digital channelizer and to adjust the saturated output power of at least some power amplifiers communicatively coupled with the digital channelizer so as to provide a significantly larger degree of bandwidth and RF power allocation flexibility, and/or to provide finer increments of bandwidth and RF power control to better match satellite resources to end user demand.

According to some implementations, a spacecraft includes a payload subsystem including a plurality of transmit antenna feeds, a digital channelizer, and a power amplification arrangement including a plurality of power amplifiers. The power amplification arrangement has at least one input communicatively coupled with an output of the digital channelizer and at least one output communicatively coupled with at least one of the plurality of transmit antenna feeds. A processor is configured to control the digital channelizer, and to adjust a saturated output power of at least one power amplifier of the plurality of power amplifiers in the power amplification arrangement.

In some examples, the at least one power amplifier may include a respective electronic power conditioner (EPC) and the processor is configured to adjust the saturated output power of the at least one power amplifier by adjusting one or more voltage outputs of the EPC.

In some examples, the plurality of power amplifiers may include one or both of solid-state power amplifiers and traveling wave tube amplifiers.

In some examples, the processor may be configured to adjust the saturated output power of the at least one power amplifier by changing one or more bias voltages, the one or more bias voltages being applied to one or more stages in an amplifier chain of the at least one power amplifier.

In some examples, the processor may be configured to adjust the saturated output power of the at least one power amplifier by tuning the RF load on an output stage of the power amplifier.

In some examples, the processor may be configured to adjust the saturated output power of the at least one power amplifier by activating or de-activating one or more output stage amplifiers which are part of a power combining network. In some examples, the one or more output stage amplifiers may be configured to provide a different power level.

In some examples, the at least one power amplifier may have a nominal saturated output power and the processor is configured to dynamically adjust the saturated output power, in steps substantially smaller than the nominal saturated output power of the amplifier. In some examples, the adjustment may be tailored to correspond with a bandwidth allocated by the digital channelizer to an individual beam associated with the at least one power amplifier.

In some examples, the power amplifier arrangement may include at least one input Butler matrix and at least one output Butler matrix. In some examples, the input Butler matrix may be implemented in the digital channelizer. In some examples, the output Butler matrix may be incorporated into a beam forming network proximate to the transmit antenna feeds.

In some examples, one or more of the plurality of power amplifiers may be incorporated into a microwave multi-port amplifier (MPA).

In some examples, the digital channelizer may be configured to allocate a commandable amount of bandwidth to one or more of the plurality of feeds.

In some examples, the digital channelizer is configured to tune a center frequency of one or more uplink beams on the spacecraft.

According to some implementations, an apparatus includes a payload subsystem of a spacecraft, the payload subsystem including a plurality of transmit antenna feeds, a digital channelizer, and a power amplification arrangement including a plurality of power amplifiers. The power amplification arrangement has at least one input communicatively coupled with an output of the digital channelizer and at least one output communicatively coupled with at least one of the plurality of transmit antenna feeds. A processor is configured to control the digital channelizer, and to adjust a saturated output power of at least one power amplifier of the plurality of power amplifiers in the power amplification arrangement.

In some examples, the processor may be included in the spacecraft.

In some examples, the processor may be ground-based.

According to some implementations, a spacecraft includes a payload subsystem that includes a plurality of receive antennas and a plurality of transmit antennas, a plurality of low noise amplifiers, a plurality of frequency converters, a plurality of power amplifiers, and a digital channelizer. The digital channelizer has inputs that are communicatively coupled with a respective receive antenna. Each of the plurality of power amplifiers has a respective input communicatively coupled with a respective output of the digital channelizer and each power amplifier has a respective output communicatively coupled with at least one of the plurality of transmit antennas. One or more processors are configured to simultaneously control the digital channelizer and the plurality of power amplifiers so as to allocate a commandable amount of satellite uplink bandwidth to each of a plurality of receive beams, allocate a commandable amount of satellite downlink bandwidth to each of a plurality of transmit beams; and adjust a saturated output power of at least one power amplifier associated with at least one of the plurality of transmit beams.

BRIEF DESCRIPTION OF THE DRAWINGS

Features of the invention are more fully disclosed in the following detailed description of the preferred embodiments, reference being had to the accompanying drawings, in which like reference numerals designate like structural element, and in which.

Figure 1:
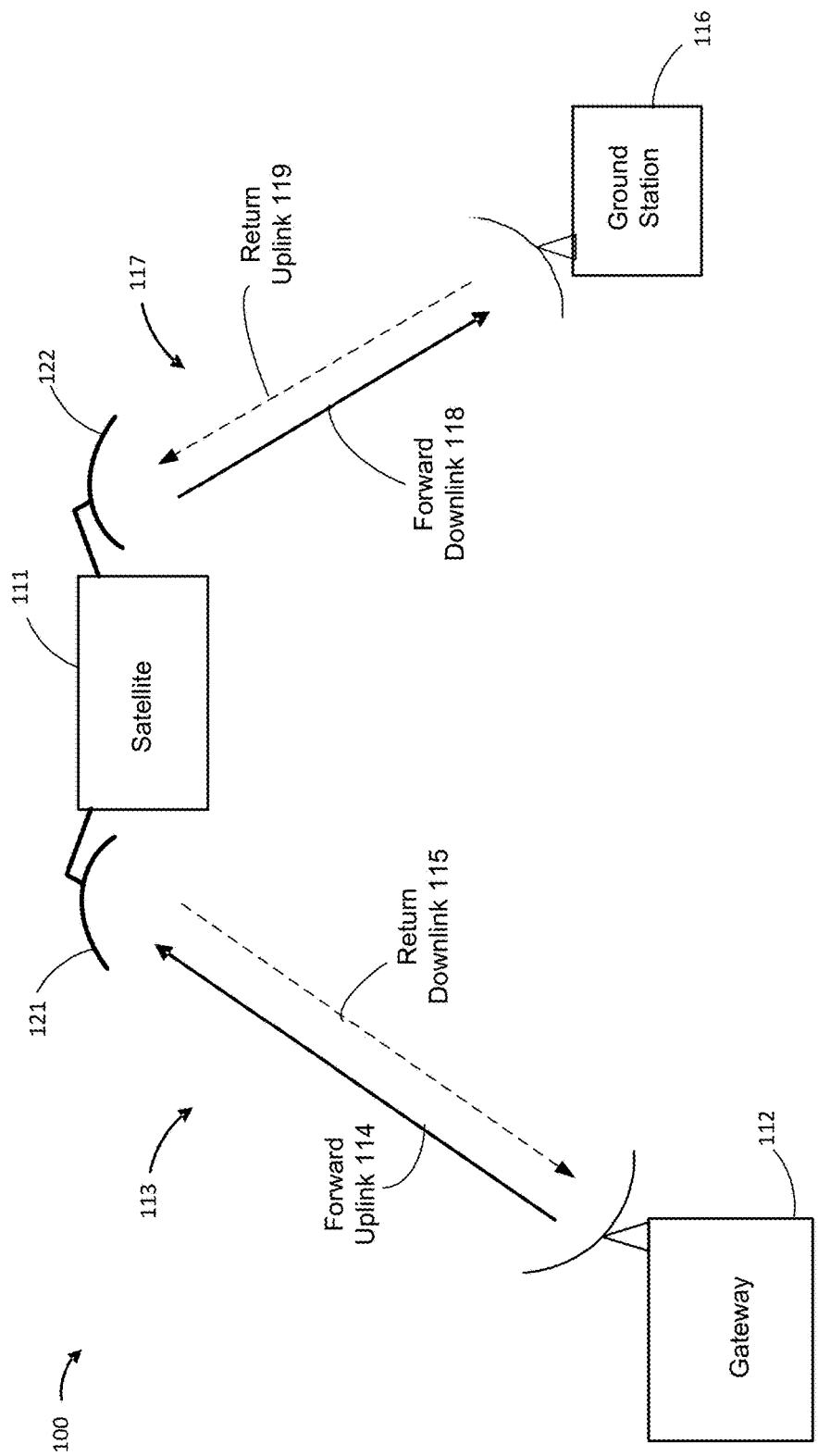
FIG. 1 illustrates a simplified diagram of a conventional satellite communications network.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when a feature is referred to as being "connected" or "coupled" to another feature, it can be directly connected or coupled to the other feature, or intervening features may be present. Furthermore, "connected" or "coupled" as used herein may include wirelessly connected or coupled. It will be understood that although the terms "first" and "second" are used herein to describe various features, these features should not be limited by these terms. These terms are used only to distinguish one feature from another feature. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items. The symbol "/" is also used as a shorthand notation for "and/or".

The terms "spacecraft", "satellite" and "vehicle" may be used interchangeably herein, and generally refer to any orbiting satellite or spacecraft system.

In an embodiment, a satellite includes a payload subsystem that has a plurality of transmit antenna feeds, at least one digital channelizer, and a power amplification arrangement that includes a plurality of power amplifiers. The power amplification arrangement has an input that is communicatively coupled with an output of the digital channelizer and an output that is communicatively coupled with at least one of the plurality of transmit antenna feeds. At least one processor is configured to control the digital channelizer so as to allocate a commandable amount of bandwidth to each of a plurality of receive and/or transmit beams, while adjusting the saturated output power of at least one power amplifier associated with at least one of the plurality of beams. A better understanding of the above features may be obtained by first referring to FIG. 1 and FIG. 2.

In FIG. 1, a simplified diagram of a conventional satellite communications network 100 is illustrated. The network includes a satellite 111, which may be located, for example, at a geostationary orbital location. The satellite 111 may be communicatively coupled, via at least one antenna 121, by a feeder link 113 to a ground station 112. The satellite 111 may also be communicatively coupled via at least one antenna 122, by a user link 117, to a ground station (or user terminal) 116. Although for clarity of illustration, only a single gateway 112 and a single ground station 116, is depicted in FIG. 1, it will be appreciated that satellite 111 may ordinarily be communicatively coupled simultaneously with a substantial number of gateways 112 and ground stations 116. Each feeder link 113 includes a forward uplink 114 and may include a return downlink 115. Each user link 117 includes a forward downlink 118 and may include a return uplink 119. The feeder link 113 and the user link 117 may operate at one or more microwave bands, including, for example L-band S-band C-band X-band Ku-band, Ka-band, Q-band and V-band.

Figure 2:
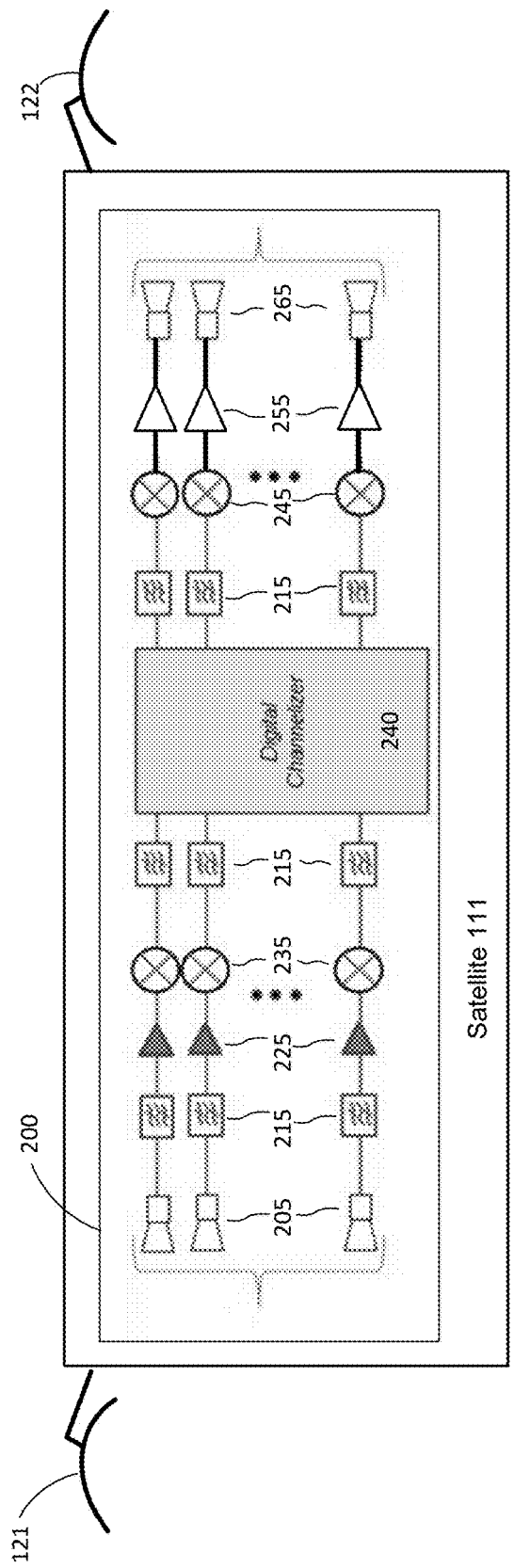
FIG. 2 illustrates a simplified block diagram of a satellite payload subsystem.

Satellite 111 will ordinarily include a payload subsystem for, inter alia, processing signals traveling between gateways 112 and ground stations 116. Referring now to FIG. 2, a simplified block diagram of a satellite payload subsystem 200 disposed within the satellite 111 is illustrated. The payload subsystem 200 may include receive antenna feeds 205, communicatively coupled with the antenna reflector 121, filters 215, low-noise amplifiers (LNAs) 225, frequency converters, including input local oscillators 235, a digital channelizer 240, frequency converters, including output local oscillators 245, power amplifiers (PAs) 255, which may or may not include linearization, and transmit antenna feeds 265 communicatively coupled with the antenna reflector 122. The active or DC power consuming hardware, such as LNAs 225, frequency converters, and PAs 255 may be arranged in redundancy rings (not illustrated) with input and output switches configured to permit continuity of service in the event of a component failure—that is, if a particular component fails, switches are actuated to route the signals to a spare unit. One or more of the PAs 255 may be traveling wave tube amplifiers (TWTAs), solid-state power amplifiers (SSPAs) or multiport amplifiers (MPAs), comprised of TWTAs or SSPAs.

The digital channelizer 240 may receive analog RF input signals by way of a quantity 'N' of receive ports, where 'N' is greater than or equal to 1. The digital channelizer 240 may enable the payload subsystem 200 to process multiple input signals and to reconfigurably distribute portions of those input signals into multiple output signals and to create reconfigurable channels to route the multiple input signals to multiple output ports. The digital channelizer 240 may include analog-to-digital converters, digital-to-analog converters, and signal processing electronics (not illustrated). The digital channelizer 240 may forward analog RF output signals by way of a quantity 'M' of transmit ports, where 'M' is greater than or equal to 1. It will be appreciated that quantity 'M' is not necessarily equal to quantity 'N'.

The digital channelizer 240 may provide a significantly larger degree of bandwidth allocation flexibility and much finer increments of bandwidth control than the mechanical RF switches described above. For example, in some implementations, the digital channelize 240 may provide incremental bandwidth allocation to a transmit antenna feeds 265 on the order of 1 MHz increment compared to approximately 36 MHz with the traditional RF mechanical switch. The digital channelizer 240 may be capable of operating over all or a substantial part of the frequency ranges that are allocated to the payload subsystem 200. The digital channelizer 240 may sub-divide the uplink frequency spectrum into smaller segments and permit fine bandwidth adjustability in the smaller segments. The digital channelizer 240 may also tune, in fine or course increments, responsive to ground commands, the center frequency and entire bandwidth allocated to a particular uplink beam on a communications satellite.

Referring still to FIG. 2, it will be appreciated that the amount of power to be handled by each high power amplifier 255 will vary as a direct function of how the digital channelizer 240 is configured to distribute bandwidth to the various transmit antenna feeds 265. In the absence of the presently disclosed techniques, therefore, at least some of the PAs 255 may be required to operate at power levels substantially less than a standard back-off from a nominal rated (saturated) power output. As a result, the efficiency of such high power amplifiers 255 may be substantially less than desirable.

Figure 3:
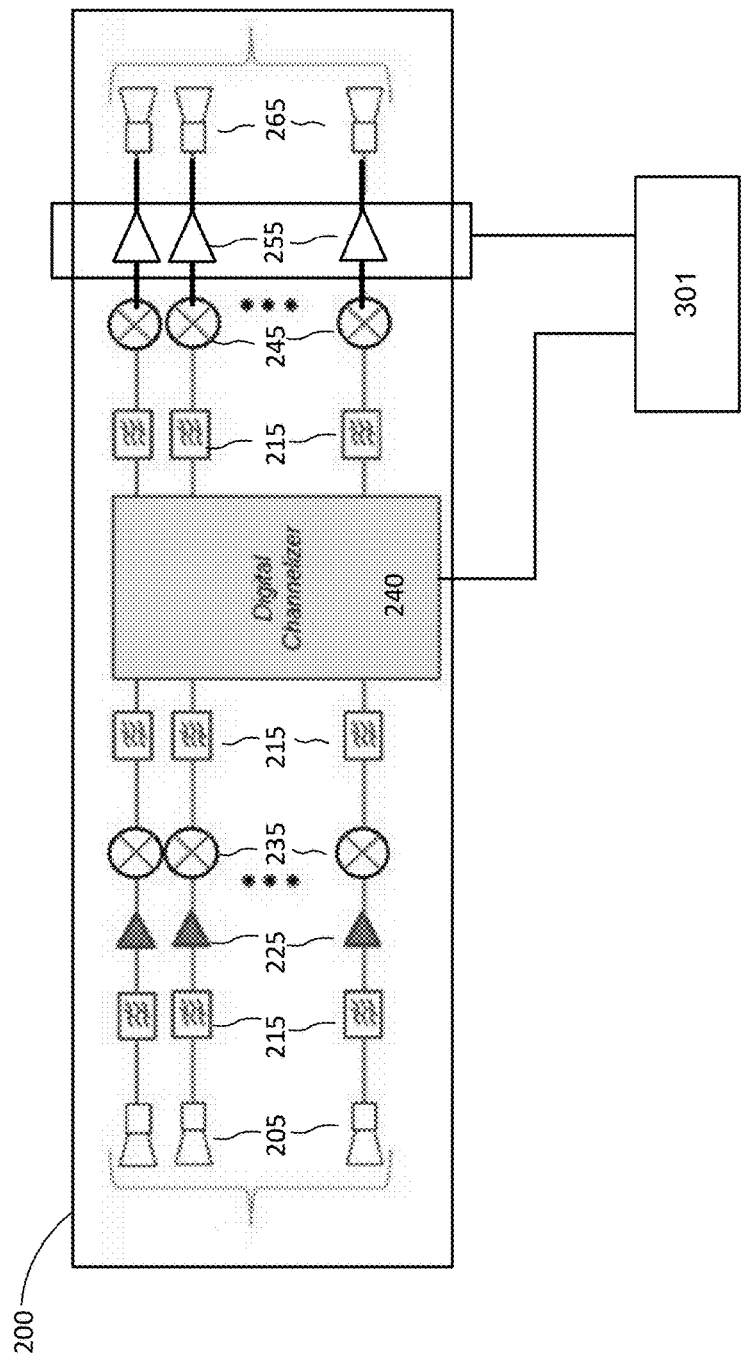
FIG. 3 illustrates a simplified block diagram of an example of a satellite payload subsystem according to an implementation.

Referring now to FIG. 3, in some implementations a processor (or processors) 301 may be communicatively coupled with digital channelizer 240 and some or all of the high power amplifiers 255. The processor 301 may be configured to control the digital channelizer 240 so as to allocate a commandable amount of bandwidth to each of a plurality of beams, and to adjust the saturated output power of at least one power amplifier 255. Advantageously, the allocation of bandwidth to the beams and the adjustment of saturated output power may occur at substantially the same time, or approximately simultaneously. As described hereinbelow, by adjusting the saturated output power of one or more PAs 255, the average efficiency of the PAs may be substantially improved.

Each PA 255 in the illustrated arrangement may include an electronic power conditioner (EPC) and a radio frequency (RF) high power amplifier (HPA). The EPC converts the spacecraft bus voltage to a level or range of levels that the HPA can accept. In the absence of the presently disclosed techniques, the voltage(s) that the EPC provides to the HPA will not be adjustable by ground command and, consequently, the saturated output power of the HPA is not adjustable. By way of contrast, in the configuration illustrated in FIG. 3, the EPC may be configured to provide voltage(s) that are adjustable by processor 301 based on, for example, commands that are relayed from the ground. Consequently, the saturated output power of the HPA is adjustable by ground command.

It will be appreciated that power amplifiers are generally most efficient when they are operated at or close to their rated (saturated) output power. Improving the operating efficiency of high power amplifier 255 can reduce demands on the spacecraft DC power subsystem and reduce heat dissipation. Ordinarily, an amplifier can provide a given quantity of output power by operating at a specific level of (i) power input and (ii) output power backoff from the rated or saturated output power. As an amplifier is operated farther from its rated output power, it becomes less efficient. The present inventors have appreciated that a system in which an amplifier's saturated output power can be varied by ground command permits a substantial increase in DC power usage efficiency.

Figure 4:
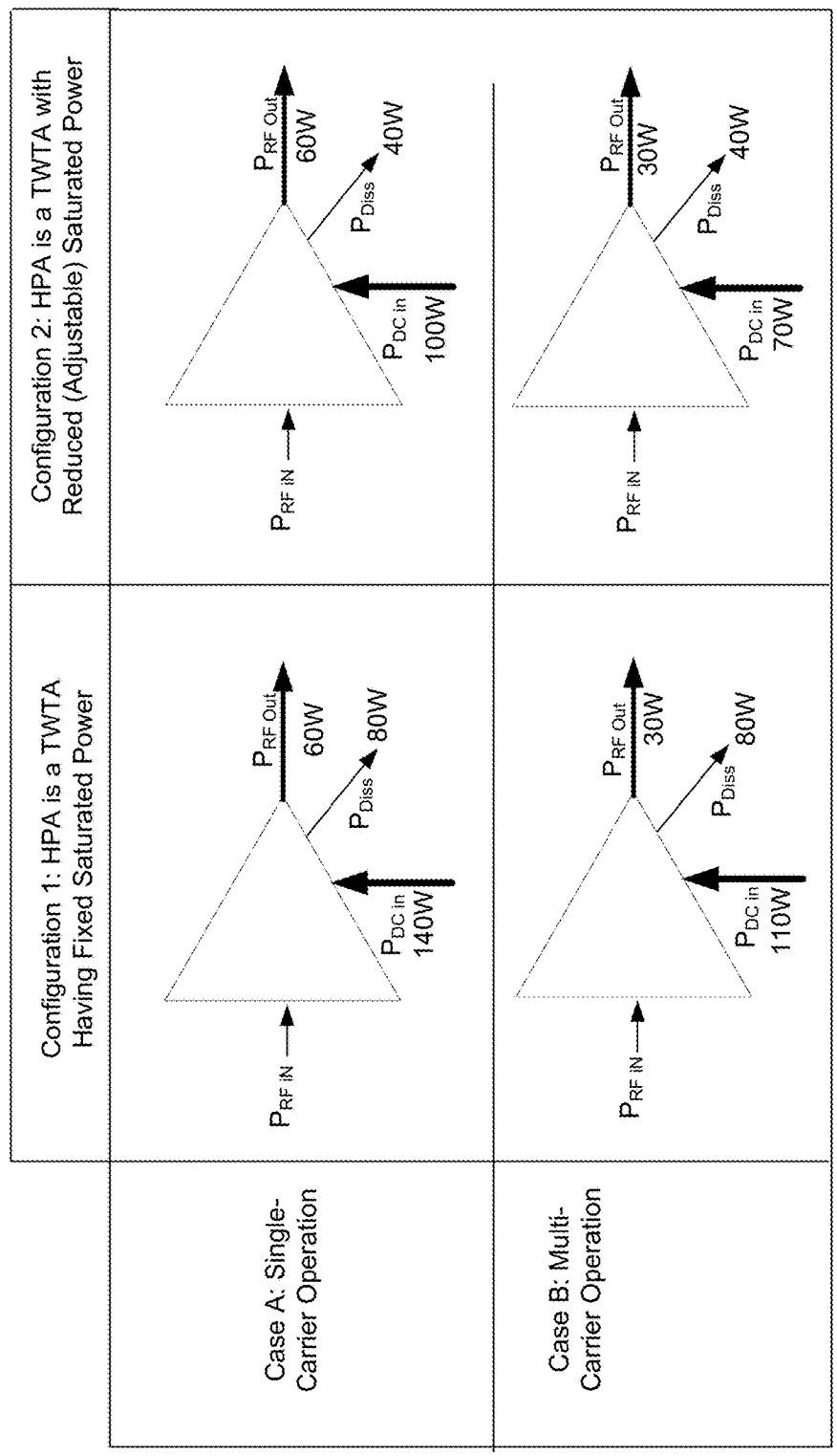
FIG. 4 illustrates a comparison of performance characteristics of traveling wave tube amplifier (TWTA) having a fixed saturated output power with a TWTA configured to have a commandably variable saturated output power.

A better understanding of the benefits of the presently disclosed techniques may be obtained by referring to FIG. 4 which illustrates a comparison of performance characteristics of an HPA having a fixed saturated power (Configuration 1, corresponding to the block diagram of FIG. 2) with an HPA configured to have a commandably variable saturated power (Configuration 2, corresponding to the block diagram of FIG. 3) for two operating conditions, "Case A" and "Case B", where the HPA is assumed to be a TWTA. Case A corresponds to Single-Carrier Operation whereas Case B corresponds to Multi-Carrier Operation.

In Case A, the illustrated example assumes that 60 W of single-carrier output RF power ("$P_{RF\ Out}$") is required. Referring first to Configuration 1, Case A, to obtain $P_{RF\ Out}$=60 W, a TWTA having a fixed 120 W saturated output power setting must be backed off at the output by 3 dB. The TWTA, having an efficiency of approximately 60% at a fixed saturated output power of 120 Watts, would dissipate approximately 80 W of waste power as heat ($P_{Diss}$) out of a total DC power in ($P_{DC\ in}$) of 200 W. Because power dissipation is roughly constant over a range of output power less than saturated power, when the TWTA is operated at 3 dB output back-off (OBO) from the saturated condition, (i.e., $P_{RF\ Out}$=120 W/2=60 W), $P_{Diss}$ remains approximately 80 W, and the required $P_{DC\ in}$ is 140 W.

Referring now to Configuration 2, Case A, in order to obtain 60 W of single-carrier RF power, in accordance with the presently disclosed techniques, the TWTA may be commanded to have 60 W saturated power and may be operated at 0 dB OBO (i.e. at saturation). With a TWTA saturated efficiency of approximately 60%, $P_{DC\ in}$ is about 100 W and $P_{Diss}$ is about 40 W. Thus, Configuration 1 requires 40 W more DC power than Configuration 2. Moreover, $P_{Diss}$, which corresponds to unwanted heat dissipation, is reduced by a factor of 50%, or approximately 40 W per TWTA.

Turning now to Case B, for multiple carrier ("multi-carrier") operation of the TWTA, the assumed requirement is to provide RF power of 30 W that is distributed among several separate RF carriers. Multi-carrier operation of an amplifier introduces distortion and intermodulation noise into the communications channel, and if excessive, the distortion and noise can significantly impair the communications signals. As a result, communications channels may be configured to operate TWTAs that carry multi-carrier traffic at an additional OBO of at least 2 to 3 dB, to ensure that the intermodulation noise and distortion are not greater than a tolerable level of impairment to the communication channel. Consequently, in Case B, the $P_{RF\ Out}$ is assumed to be backed off to 30 watts.

Referring first to Configuration 1, Case B, to obtain $P_{RF\ Out}$=30 W, the TWTA, having a fixed 120 W saturated output power setting, must be backed off at the output by 6 dB. As noted above, power dissipation is roughly constant over a range of output power less than saturated power. Accordingly, when the TWTA is operated at 6 dB OBO from the saturated condition, (i.e., $P_{RF\ Out}$=120 W/4=30 W), $P_{Diss}$ remains approximately 80 W, and the required $P_{DC\ in}$ is 110 W.

Referring now to Configuration 2, Case B, in order to obtain 30 watts of multi-carrier RF power, in accordance with the presently disclosed techniques, the TWTA may be commanded to have 60 W saturated power and may be operated at 3 dB OBO (30 W), to ensure that the intermodulation noise levels are tolerable. The amount of DC power that is required is the sum of $P_{Diss}$ (40 W) and $P_{RF\ Out}$ (30 W), which is a total of 70 W. Thus, similarly to Case A, $P_{DC\ in}$ and $P_{Diss}$, are each reduced by about 40 W.

The example performance characteristics depicted in FIG. 4 are representative of travelling wave tube amplifier (TWTA) implementations. Solid State Power Amplifier (SSPA) implementations are also within the contemplation of the present inventors. Although SSPAs at microwave frequencies are generally less power efficient than TWTAs, key benefits of SSPAs compared to TWTAs include cost, size, and weight. An SSPA may be made small enough to fit directly behind radiating elements of antennas, including phased array antennas. In a satellite system in which the radiating elements of the receive and transmit antennas contain LNAs and HPAs, respectively, and the individual LNAs and HPAs (or small groups of LNAs and HPAs) are communicatively coupled to the ports of a digital channelizer, it is possible to introduce a beam forming function in the channelizer for both the receive and transmit beams. The beam forming function can provide a wide range of shaped beams on the surface of the earth. If the HPAs are of a variable power design, then it is possible to vary both the shape and the equivalent isotropic radiating power (EIRP) of the transmit beams. Coverages and EIRP can be adjusted in orbit to match user demand.

Figure 5:
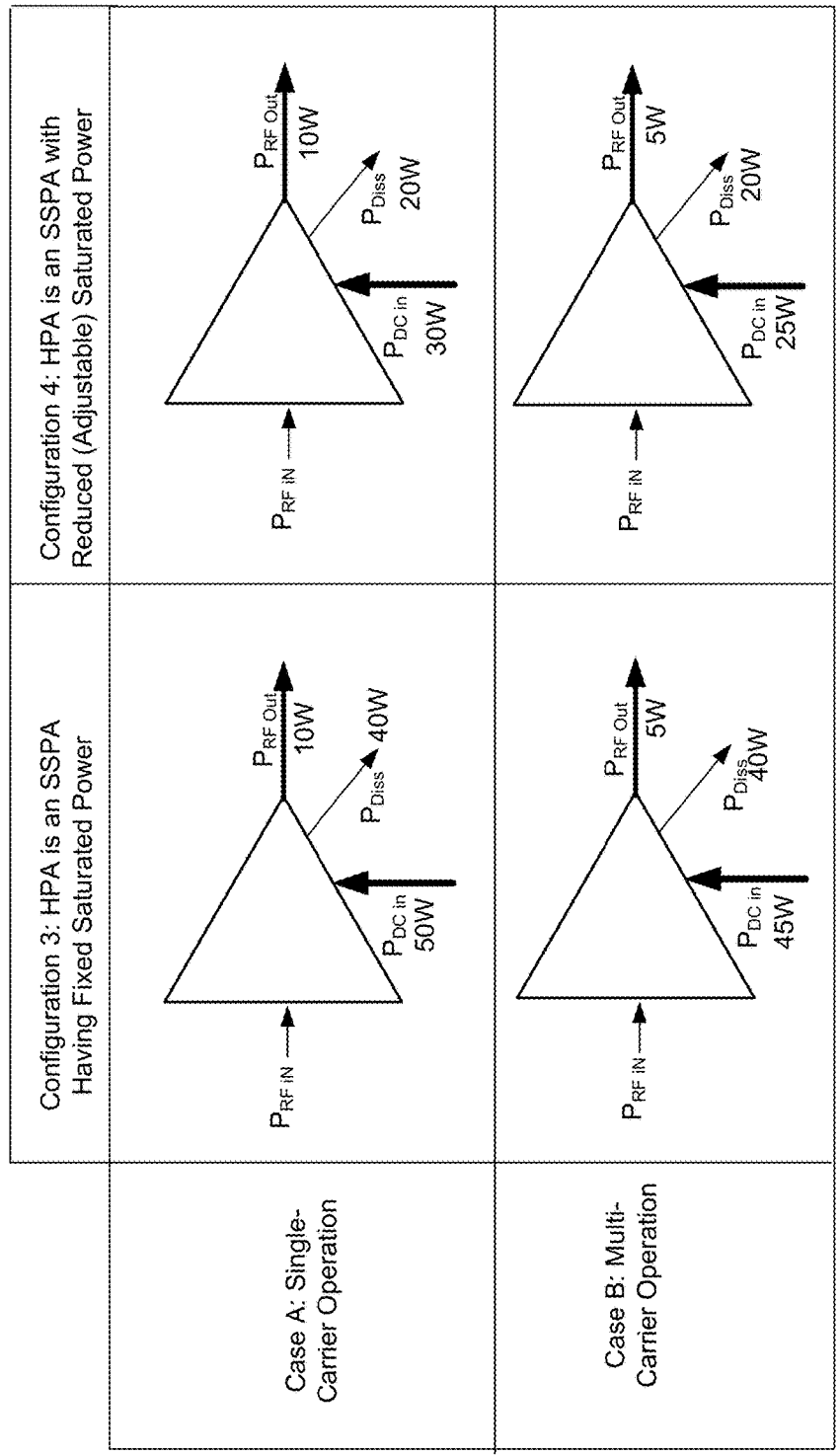
FIG. 5 illustrates a comparison of performance characteristics of an example solid-state power amplifier (S SPA) having a fixed saturated output power with an example SSPA configured to have a commandably variable saturated output power.

FIG. 5 illustrates a comparison of performance characteristics of an example SSPA having a fixed saturated power (Configuration 3, corresponding to the block diagram of FIG. 2) with an example SSPA configured to have a commandably variable saturated power (Configuration 4, corresponding to the block diagram of FIG. 3) at operating conditions suitable for Single-Carrier Operation ("Case A") and Multi-Carrier Operation ("Case B").

In Case A, the illustrated example assumes that 10 W of single-carrier $P_{RF\ Out}$ is required. Referring first to Configuration 3, Case A, to obtain $P_{RF\ Out}$=10 W of RF output, an SSPA having a fixed 20 W saturated output power setting must be backed off at the output by 3 dB. The SSPA, having an efficiency of approximately 33% at a fixed saturated output power of 20 Watts, would exhibit a $P_{Diss}$ of approximately 40 W out of a $P_{DC\ in}$ of 60 W. Because power dissipation is roughly constant over a range of output power less than saturated power, when the SSPA is operated at 3 dB OBO from the saturated condition, (i.e., $P_{RF\ Out}$=10 W/2=5 W), $P_{Diss}$ remains approximately 40 W, and the required $P_{DC\ in}$ is 50 W.

Referring now to Configuration 4, Case A, in order to obtain 10 W of single-carrier RF power, in accordance with the presently disclosed techniques, the SSPA may be commanded to have 10 W saturated power and may be operated at 0 dB OBO (i.e. at saturation). With an SSPA saturated efficiency of approximately 33%, $P_{DC\ in}$ is about 30 W and $P_{Diss}$ is about 20 W. Thus, Configuration 3 requires 20 W more DC power than Configuration 4. Moreover, $P_{Diss}$, which corresponds to unwanted heat dissipation, is reduced by a factor of 50%, or approximately 20 W per SSPA.

Turning now to Case B, for multiple carrier operation of the S SPA, the assumed requirement is to provide RF power of 5 W that is distributed among several separate RF carriers.

Referring first to Configuration 3, Case B, to obtain $P_{RF\ Out}$=5 W, the S SPA, having a fixed 20 W saturated output power setting must be backed off at the output by 6 dB. As noted above, power dissipation is roughly constant over a range of output power less than saturated power. Accordingly when the SSPA is operated at 6 dB OBO from the saturated condition (i.e., $P_{RF\ Out}$=20 W/4=5 W), $P_{Diss}$ remains approximately 40 W, and the required $P_{DC\ in}$ is 45 W.

Referring now to Configuration 4, Case B, in order to obtain 5 W of multi-carrier RF power, in accordance with the presently disclosed techniques, the SSPA may be commanded to have 10 W saturated power and may be operated at 3 dB OBO (5 W), to ensure that the intermodulation noise levels are tolerable. The amount of DC power that is required is the sum of $P_{Diss}$ (20 W) and $P_{RF\ Out}$ (5 W), which is a total of 25 W. Thus, similarly to Case A, $P_{DC\ in}$ and $P_{Diss}$, are each reduced by about 20 W.

Thus, the benefits of the presently disclosed techniques include lower DC power and lower thermal dissipation whether the HPAs are TWTAs or SSPAs.

In some implementations, an HPA configured to have a commandably variable saturated power may be a building block of a microwave Multi-Port Amplifier (MPA). In some implementations the MPA or a plurality of HPAs may be configured as an amplifier network, the amplifier network including any number of HPAs, the HPAs having inputs and outputs that are connected to Butler matrices, as illustrated, for example, in FIG. 6. The Butler matrices 650 and 660 may permit arbitrary distribution of RF power among the MPA output ports. In the extreme case, all of the RF power from all of the HPAs in a particular MPA may be directed to any single output port with zero output power directed to the remaining output ports. The MPA may also be operated to provide equal RF power to all of its output ports. In such implementations, the presently disclosed techniques may permit an additional dimension of RF power adjustability to be obtained from an MPA.

Figure 6:
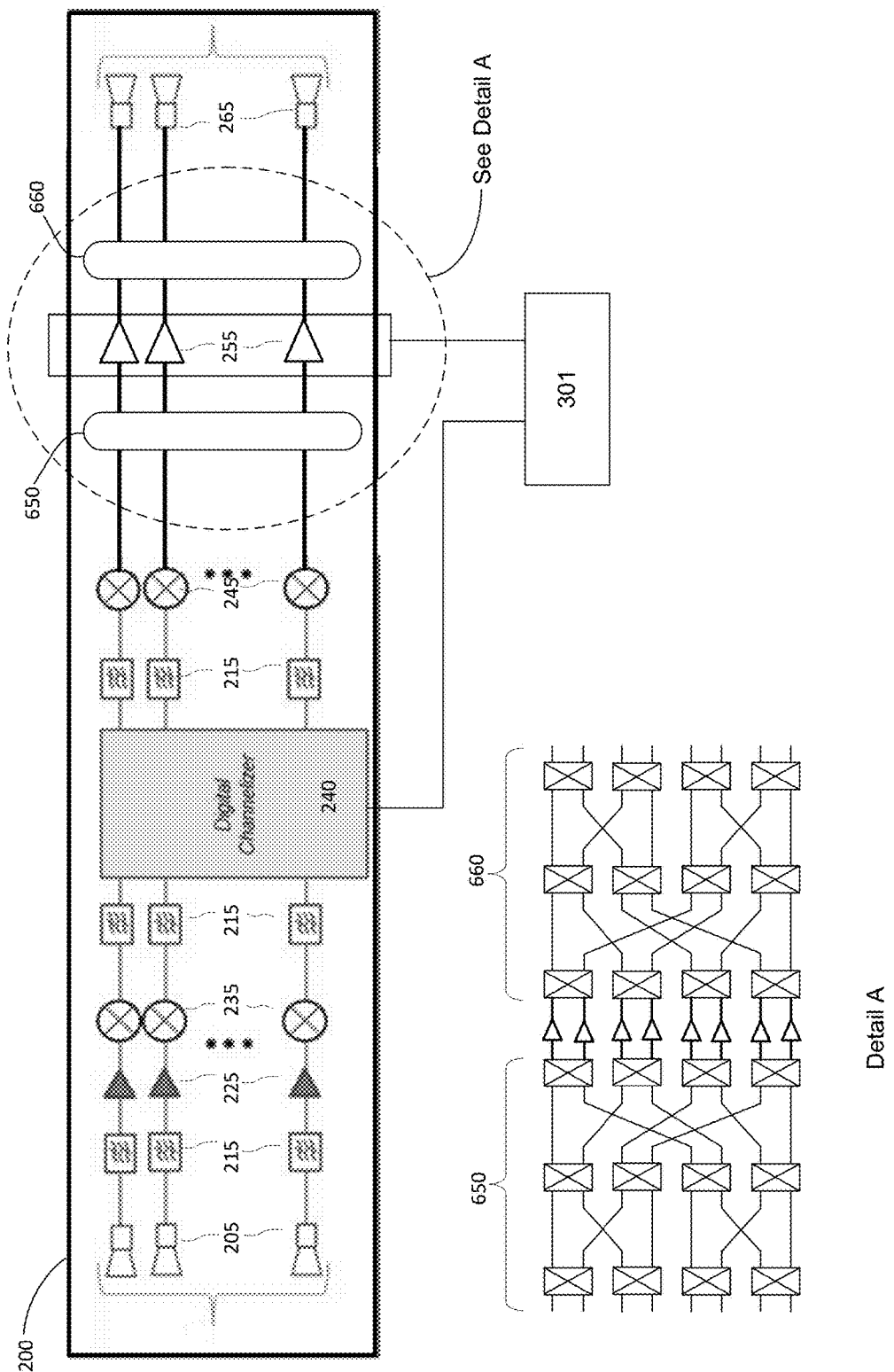
FIG. 6 illustrates a simplified block diagram of an example of a satellite payload subsystem according to a further implementation.

Although Butler matrices 650 and 660 are illustrated in FIG. 6 as being separate arrangements proximate, respectively, to the input and output of the power amplifiers, it will be understood that other arrangements are within the contemplation of the present invention. For example, the functionality of Butler matrix 650 may be implemented in the digital channelizer 240. In some implementations, Butler matrix 660 may be merged into a beam forming network proximate to the transmit antenna feeds 265.

Some techniques for adjusting the saturated output power of an HPA include (1) changing one or more DC bias voltage(s), which are applied to one or more stages in an amplifier chain of the HPA, (2) tuning the RF load on an output stage of the HPA, and activating or de-activating one or more output stage amplifiers which are part of a power combining network, and (3) activating one of several parallel output stages, each of which is capable of providing a different power level. Other techniques to vary the saturated output power of the HPA are also within the contemplation of the present inventors.

The disclosed payload subsystem, including a processor configured to simultaneously control the digital channelizer and to adjust the saturated output power of at least some HPAs communicatively coupled with the digital channelizer, may provide a significantly larger degree of bandwidth and RF power allocation flexibility, and may provide much finer increments of bandwidth and RF power, than has been achieved in the absence of the presently disclosed techniques.

More particularly, output RF power from each HPA may be dynamically adjusted in relatively small steps (1-25% of the nominal saturated output power, for example), and may be tailored to correspond with the bandwidth allocated by the channelizer to an individual beam associated with the HPA. Because adjustment of the output RF power results from varying the saturated output power of the HPA, an improvement in efficiency of the HPA is achieved. Because both bandwidth and power allocated to each beam are capable of dynamic real-time adjustment by way of ground command and/or the processor 301, the presently disclosed techniques enable a high degree of payload configuration flexibility with reduced HPA power efficiency penalty.

In some implementations, an area-beam satellite system, may include a payload subsystem including a plurality of fixed and/or steerable receive and transmit antennas, a plurality of LNAs, a plurality of frequency converters, a digital channelizer having inputs that are communicatively coupled with a respective receive antenna, a plurality of power amplifiers, each power amplifier having a respective input communicatively coupled with a respective output of the digital channelizer and each power amplifier having a respective output communicatively coupled with at least one of the plurality of transmit antenna. The satellite system may also include a processor or processors configured to simultaneously control the digital channelizer and one or more power amplifiers so as to allocate a commandable amount of satellite uplink bandwidth to each of a plurality of receive beams, allocate a commandable amount of satellite downlink bandwidth to each of a plurality of transmit beams, and to adjust the saturated output power of at least one power amplifier associated with at least one of the plurality of transmit beams.

In some implementations, a multiple spot-beam satellite system may include a payload subsystem including a plurality of fixed and/or steerable receive and transmit spot beam antennas with a single feed per spot beam, a plurality of LNAs having inputs that are communicatively coupled to one or more receive spot beams, a plurality of frequency converters, digital channelizer(s) having inputs that are communicatively coupled with a respective receive spot beam, a plurality of power amplifiers, each power amplifier having a respective input communicatively coupled with a respective output of the digital channelizer and each power amplifier having a respective output communicatively coupled with at least one of the plurality of transmit spot beams. The satellite system may also include a processor or processors configured to simultaneously control the digital channelizer(s) and one or more power amplifiers so as to allocate a commandable amount of satellite uplink bandwidth to each of a plurality of receive spot beams, allocate a commandable amount of satellite downlink bandwidth to each of a plurality of transmit spot beams, and to adjust the saturated output power of at least one high power amplifier (HPA) associated with at least one of the plurality of transmit beams.

In some implementations, the variable power HPA may be configured as a multi-port amplifier (MPA) which includes identical or nearly identical fixed power amplifiers having inputs that are communicatively coupled to a digital channelizer. In some implementations, output power levels of the HPA's may be set and varied approximately in unison. In some implementations an input Butler Matrix network function is implemented in a plurality of digital channelizer output ports.

In some implementations, a multiple spot-beam satellite system may include a payload subsystem including a plurality of fixed and/or steerable receive and transmit spot beam antennas with multiple feeds per spot beam, a plurality of LNAs having inputs that are communicatively coupled to one or more receive spot beam feed elements, a plurality of frequency converters, digital channelizer(s) having inputs that are communicatively coupled with a respective receive spot beam feed element, a plurality of power amplifiers, each power amplifier having a respective input communicatively coupled with a respective output of the digital channelizer and each power amplifier having a respective output communicatively coupled with at least one of the plurality of transmit spot feed elements. The satellite system may also include a processor or processors configured to simultaneously control the digital channelizer(s) and one or more power amplifiers so as to allocate a commandable amount of satellite uplink bandwidth to each of a plurality of receive spot beams, provide beam forming function to a plurality of receive spot beams, allocate a commandable amount of satellite downlink bandwidth to each of a plurality of transmit spot beams, provide beam forming function to a plurality of transmit spot beams, and to adjust the saturated output power of at least one power amplifier associated with at least one of the plurality of transmit spot beam feed elements.

In some implementations, the satellite system may include an area beam and/or single feed element per receive and/or transmit spot beam.

In some implementations, the output Butler Matrix network function is incorporated into a beam forming network proximate to the transmit antenna feeds.

Thus, a digital payload that includes variable high power amplifiers and a digital channelizer has been described. The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. A spacecraft, comprising
    a payload subsystem including a plurality of transmit antenna feeds, a digital channelizer, and a power amplification arrangement including a plurality of power amplifiers, the plurality of power amplifiers including at least one power amplifier having a commandably variable saturated power, the power amplification arrangement having at least one input communicatively coupled with an output of the digital channelizer and at least one output communicatively coupled with at least one of the plurality of transmit antenna feeds; and
    a processor configured to control the digital channelizer so as to allocate a commandable amount of bandwidth to each of a plurality of receive and/or transmit beams, and dynamically make an adjustment to the variable saturated power of the at least one power amplifier of the plurality of power amplifiers in the power amplification arrangement; wherein
        the adjustment is tailored to account for a change in operating power of the at least one amplifier resulting from a change in bandwidth allocated by the digital channelizer to an individual beam associated with the at least one power amplifier.

2. The spacecraft of claim 1, wherein the at least one power amplifier includes a respective electronic power conditioner (EPC) and the processor is configured to adjust the variable saturated power of the at least one power amplifier by adjusting one or more voltage outputs of the EPC.

3. The spacecraft of claim 1, wherein the plurality of power amplifiers includes one or both of solid-state power amplifiers and traveling wave tube amplifiers.

4. The spacecraft of claim 1, wherein the processor is configured to adjust the variable saturated power of the at least one power amplifier by changing one or more bias voltages, the one or more bias voltages being applied to one or more stages in an amplifier chain of the at least one power amplifier.

5. The spacecraft of claim 1, wherein the processor is configured to adjust the variable saturated power of the at least one power amplifier by tuning the RF load on an output stage of the power amplifier.

6. The spacecraft of claim 1, wherein the processor is configured to adjust the variable saturated power of the at least one power amplifier by activating or de-activating one or more output stage amplifiers which are part of a power combining network.

7. The spacecraft of claim 6, each of the one or more output stage amplifiers is configured to provide a different power level.

8. The spacecraft of claim 1, wherein the at least one power amplifier has a nominal saturated power and the processor is configured to dynamically make an adjustment to the variable saturated power, in steps substantially smaller than the nominal saturated power of the amplifier.

9. The spacecraft of claim 1, wherein the power amplifier arrangement includes at least one input Butler matrix and at least one output Butler matrix.

10. The spacecraft of claim 9, wherein the input Butler matrix is implemented in the digital channelizer.

11. The spacecraft of claim 9, wherein the output Butler matrix is incorporated into a beam forming network proximate to the transmit antenna feeds.

12. The spacecraft of claim 1, wherein one or more of the plurality of power amplifiers are incorporated into a microwave multi-port amplifier (MPA).

13. The spacecraft of claim 1, wherein the digital channelizer is configured to allocate a commandable amount of bandwidth to one or more of the plurality of feeds.

14. The spacecraft of claim 1, wherein the digital channelizer is configured to tune a center frequency of one or more uplink beams on the spacecraft.

15. An apparatus, comprising
    a payload subsystem of a spacecraft, the payload subsystem including a plurality of transmit antenna feeds, a digital channelizer, and a power amplification arrangement including a plurality of power amplifiers, the plurality of power amplifiers including at least one power amplifier having a commandably variable saturated power, the power amplification arrangement having at least one input communicatively coupled with an output of the digital channelizer and at least one output communicatively coupled with at least one of the plurality of transmit antenna feeds; wherein
    a processor is configured to control the digital channelizer so as to allocate a commandable amount of bandwidth to each of a plurality of receive and/or transmit beams, and dynamically make an adjustment to the variable saturated power of the at least one power amplifier of the plurality of power amplifiers in the power amplification arrangement; wherein the adjustment is tailored to account for a change in operating power of the at least one amplifier resulting from a change in bandwidth allocated by the digital channelizer to an individual beam associated with the at least one power amplifier.

16. The apparatus of claim 15 wherein the processor is included in the spacecraft.

17. The apparatus of claim 15 wherein the processor is ground-based.

18. A spacecraft, comprising:
    a payload subsystem that includes a plurality of receive antennas and a plurality of transmit antennas;
    a plurality of low noise amplifiers;
    a plurality of frequency converters;
    a plurality of power amplifiers, including at least one power amplifier having a commandably variable saturated power; and
    a digital channelizer, wherein:
        the digital channelizer has inputs that are communicatively coupled with a respective receive antenna;

each of the plurality of power amplifiers has a respective input communicatively coupled with a respective output of the digital channelizer and each power amplifier has a respective output communicatively coupled with at least one of the plurality of transmit antennas; and one or more processors are configured to simultaneously control the digital channelizer and the plurality of power amplifiers so as to:
- allocate a commandable amount of satellite uplink bandwidth to each of a plurality of receive beams;
- allocate a commandable amount of satellite downlink bandwidth to each of a plurality of transmit beams; and
- dynamically make an adjustment to the variable saturated power, the adjustment being tailored account for a change in operating power of the at least one amplifier resulting from a change in bandwidth allocated by the digital channelizer to an individual beam associated with the at least one power amplifier.

19. The spacecraft of claim 18, wherein the at least one power amplifier includes a respective electronic power conditioner (EPC) and the processor is configured to adjust the variable saturated power of the at least one power amplifier by adjusting one or more voltage outputs of the EPC.

* * * * *